United States Patent
Woodall et al.

(10) Patent No.: US 7,038,311 B2
(45) Date of Patent: May 2, 2006

(54) THERMALLY ENHANCED SEMICONDUCTOR PACKAGE

(75) Inventors: Joe D. Woodall, Gunter, TX (US); Robert F. Mortan, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/740,322

(22) Filed: Dec. 18, 2003

(65) Prior Publication Data

US 2005/0133906 A1   Jun. 23, 2005

(51) Int. Cl.
*H01L 23/34* (2006.01)
*H01L 23/52* (2006.01)

(52) U.S. Cl. .................. 257/706; 257/707; 257/710; 257/712; 257/713; 257/720; 257/783

(58) Field of Classification Search ................ 257/675, 257/705–708, 710–719, 783

See application file for complete search history.

(56) References Cited

U.S. PATENT DOCUMENTS

| | | | | |
|---|---|---|---|---|
| 4,509,096 A | * | 4/1985 | Baldwin et al. | 361/719 |
| 4,876,588 A | * | 10/1989 | Miyamoto | 257/706 |
| 5,294,750 A | * | 3/1994 | Sakai et al. | 174/52.4 |
| 5,367,193 A | * | 11/1994 | Malladi | 257/707 |
| 5,438,478 A | * | 8/1995 | Kondo et al. | 361/704 |
| 5,644,163 A | * | 7/1997 | Tsuji | 257/706 |
| 6,552,264 B1 | * | 4/2003 | Carden et al. | 174/52.4 |

FOREIGN PATENT DOCUMENTS

| | | | | |
|---|---|---|---|---|
| JP | 62-52949 | * | 3/1987 | 257/706 |
| JP | 63-136655 | * | 6/1988 | 257/716 |
| JP | 6-61386 | * | 3/1994 | 257/713 |

* cited by examiner

*Primary Examiner*—Jasmine Clark
(74) *Attorney, Agent, or Firm*—W. James Brady, III; Frederick J. Telecky, Jr.

(57) ABSTRACT

A thermally enhanced BGA semiconductor device 10 having a heat sink 12 formed from a single piece of material with an expanded base and a pedestal in contact with a semiconductor chip 11. The pedestal is aligned through a window opening in a substrate 13 and the top surface of the base is adhered to the substrate. The heat sink 12 with an expanded base provides a path for rapid and efficient heat spreading and dissipation, a stand-off and an aid to improved package planarity during reflow to a PCB, and a long path for ingress of contaminants into the package. The device is amenable to high volume, low cost production.

20 Claims, 4 Drawing Sheets

THERMALLY ENHANCED SEMICONDUCTOR PACKAGE

FIELD OF THE INVENTION

The invention relates generally to a semiconductor device, and more specifically to a thermally enhanced semiconductor package; and to a method of fabrication.

BACKGROUND OF THE INVENTION

An integrated circuit package provides electrical connections from an integrated circuit chip to external conductors, and protection of the chip from environmental conditions. Additionally, management of thermal dissipation is an increasingly important consideration in the development of packages for many integrated circuit chips. Circuits used in telecommunications and other applications may dissipate power in excess of several Watts. Consequently, it is necessary to provide an integrated circuit package having an efficient method of heat removal. Typically a heat sink for an integrated circuit is provided by mounting the chip in contact with a thermally conductive metal or alloy structure having at least one surface exposed to the ambient environment or to a secondary thermally conductive element for dissipating heat. Thermally conductive structures may be referred to as heat sinks or heat sinks. In those devices requiring high levels of heat dissipation, a heat sink may contact fins to increase the exposed surface area. However, such structures add considerably to the package size, the amount of board space required, and to costs.

With the continued drive towards reducing the dimensions of integrated circuit packages, conventional packaging techniques are severely challenged to provide effective heat dissipation in a readily manufacturable and reliable package.

Surface mounted Ball Grid Array (BGA) packages include external contacts made by an array of solder balls on the bottom of the package. These packages are of considerable interest for many integrated circuit applications because the devices are generally smaller in size and have lower inductance than leaded packages. The substrate for a BGA package may comprise a laminate, a composite, a ceramic, or in the case of smaller packages, a flexible film.

In an increasing number of devices, the chip is encapsulated in a molded plastic with the chip backside attached to a low cost substrate or interposer having low density conductive layers. Flexible tape or low cost laminate substrates typically have very low thermal conductivity and consequently, the IC chip is separated from the PCB by a thermal barrier and from the ambient air by a poorly conductive encapsulation. In particular, in the ever increasing number of BGA devices having lower cost substrates, there is a need for a reliable, readily manufactured package with thermally enhanced performance.

SUMMARY OF THE INVENTION

A thermally enhanced BGA packaged semiconductor device is provided, having a heat sink shaped to provide a pedestal for mounting the semiconductor chip, and a wider base below the pedestal. In accordance with one embodiment of the invention, a heat sink comprising a single piece of thermally conductive metal or alloy, such as copper or aluminum, having a pedestal approximately equal to the substrate thickness, extends into and through a window in the substrate to provide a chip support pad. A shelf atop the heat sink base is attached to the underside of the substrate and defines the perimeter of the larger base. The window in the substrate is aligned to the pedestal and attached to the sink base, thereby providing an assemblage which secures the substrate and heat sink both horizontally and vertically through the assembly process.

In an alternate embodiment, the heat sink is "T" shaped having a vertical trunk and horizontal top section. The vertical trunk of the "T" shaped heat sink extends through the window in the substrate and the horizontal top rests on the first surface of the substrate forming a large chip mount pad for spreading heat. The first surface of the substrate surrounding the window is adhered to the underside of the top of the "T". A device having a "T" shaped heat sink has advantages for large chip sizes, and for those devices having an array of solder balls covering a substantial portion of the substrate area.

In either embodiment, that portion of the heat sink below the substrate has approximately the same thickness as the solder balls. The heat sink can make contact with the PCB, thereby providing an effective path for heat removal from the chip. The wide portion of the heat sink allows heat to be spread laterally, as well as vertically through the base and away from the chip.

The BGA substrate is a laminate, composite, or flexible film material having a centrally located window opening, a plurality of bond pads on the first surface, and an array of solder balls outside the window and/or around the package perimeter on the second surface. The substrate or interposer window provides an opening through which the heat sink is aligned and adhered. The surface of the substrate or interposer surrounding the window is adhered to the wider portion of the heat sink, thereby providing a stable assemblage throughout the package fabrication process.

The heat sink, preferably a square or rectangular structure, includes a first horizontal surface equal to or larger than the area of the chip. In the first embodiment, the first set of vertical walls extend from the first horizontal surface to a height approximately equal to the substrate thickness to a second horizontal surface fanning laterally from each of the four sides to form a shelf. A second set of vertical walls extend from the second horizontal surface perimeter to a third horizontal surface which forms the bottom of the heat sink. The large heat sink bottom can contact and dissipate heat into a PCB. In the second embodiment, having a "T" shaped heat sink with the top portion atop the substrate, the thickness of the top portion may be approximately equal to that of the chip, for example.

Thickness of the sink below the substrate is approximately equal to the height of the solder balls. The perimeter of the heat sink base is related to the location of the innermost row of solder balls arrayed on the substrate. A clearance of approximately one solder ball diameter between the heat sink and solder balls is preferred in anticipation of some collapse of solder balls during the reflow process. The heat sink base is made as large as the design allows for increased heat spreading and dissipation.

The heat sink preferably comprises a single piece of metal or alloy having a thermal expansion coefficient similar to that of the substrate in order to minimize thermally induced stresses. The heat sink surface is coated with an adhesion promoting material for enhanced adhesion to both the substrate and chip attach adhesives. Appropriate coatings include a film of anodized Cu or Al, or a deposited film having a high surface area or reactive sites.

A chip is attached to the first surface of the heat sink by a thermally conductive adhesive or grease, and wire bonds electrically connect the chip terminals to pads on the substrate. Preferably, the chip, bond wires and first surface of the substrate are overmolded with a thermosetting polymer, and a plurality of solder balls are subsequently attached at specified locations on the second surface of the substrate.

Thermal dissipation from the chip is primarily through the semiconductor chip backside and into the heat sink where it is spread across the width of the sink, through the base, and into the PCB. A solid conductive metal heat sink introduces only a single thermal barrier, i.e. the adhesive, between the chip and sink, whereas, conventional heat dissipation techniques may include multiple interfaces and thermal barriers. The heat sink construction of a single piece of material lends itself to rapid thermal response and thereby supports reliable chip operation.

In addition to rapidly spreading and dissipating heat, the heat sink having an expanded base provides a fixed stand-off height between the package and PCB during the solder reflow process. Further, the expanded base of the heat sink supports improved package planarity by controlling solder ball collapse. The relatively large area for heat sink shelf attachment to the substrate creates a long path which helps to minimize ingress of contaminants into the package, whereas straight sides of traditional heat sinks or thermal columns provide less area for adhesion and less protection from contaminants.

For a more complete understanding of the present invention, and the advantages thereof, reference is made to the following description taken in connections with the accompanying drawings.

DETAILED DESCRIPTION OF THE DRAWINGS

Figure 1:
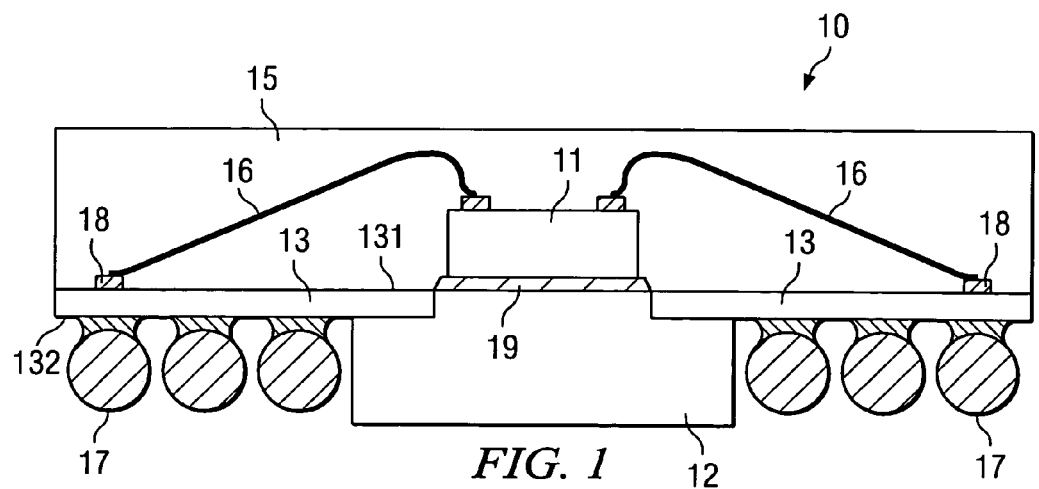
FIG. 1 is a cross sectional view of a thermally enhanced BGA package in accordance with the present invention.

FIG. 1 is a cross sectional view of an embodiment of the present invention. The thermally enhanced ball grid array (BGA) device includes a semiconductor chip 11 adhered by a thermally conductive material 19 to a heat sink 12, and a substrate 13 having a plurality of bonding pads 18 on the first surface 131 and an array of solder balls 17 on the second surface 132. The chip 11 is interconnected to bond pads 18 on the substrate 13 by a plurality of bond wires 16. The first surface 131 of the substrate, the chip 11, and bond wires 16 are encased in a polymeric compound 15, and the solder ball 17 contacts and base of the heat sink 12 extend from the second surface 132 of the substrate.

Figure 2:
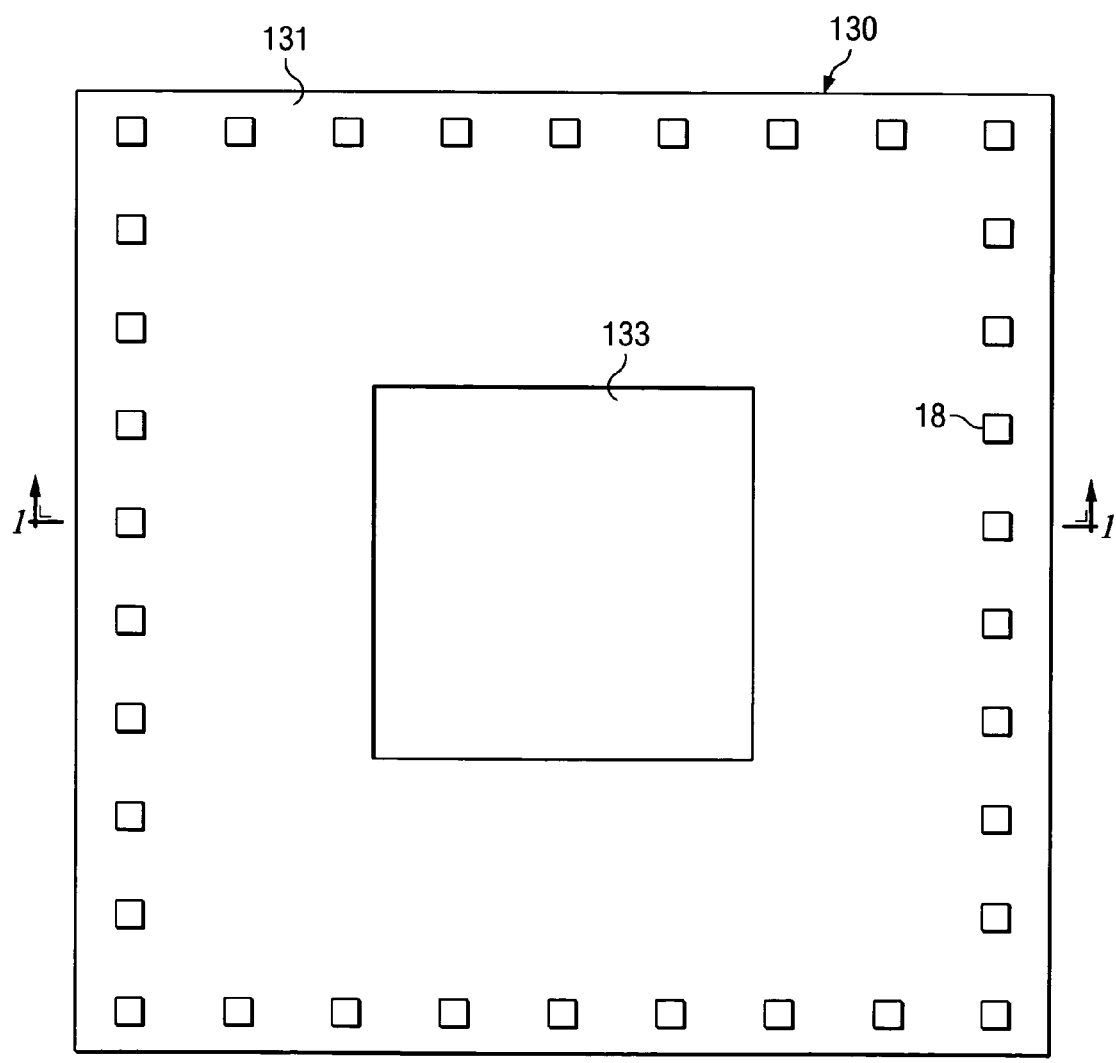
FIG. 2 is a top view of a substrate having a window through which the heat sink pedestal of the present invention extends.

FIG. 2 is a top view of a substrate 130 having a window opening 133 in the center. In one embodiment, the substrate 130 comprises a flexible film having a plurality of bond pads 18 and patterned conductors (not shown) on the first surface 131. On the opposite surface 132 of the substrate (FIG. 1), a plurality of solder balls 17 are arrayed surrounding the heat sink base and/or around the substrate perimeter. A window 133 has been etched or punched through the center of the substrate 130 wherein the heat sink is to be located.

In an alternate embodiment, substrate 130 comprises a laminate material having conductors and bond pads on the first surface and an array of solder balls 17 on the second surface 132. In FIG. 2, the substrate 130 and window 133 are illustrated as square shaped, but in yet another embodiment, the substrate and/or the window may be rectangular or another such shape. The window shape conforms to that of the heat sink pedestal.

Figure 3:
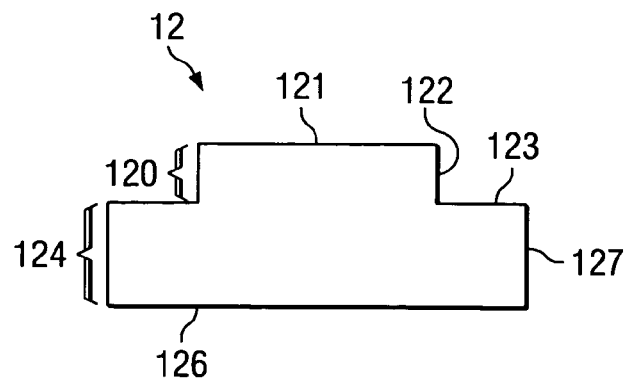
FIG. 3 is a cross sectional view of an example of a heat sink used in the current invention.

Heat sink 12 of the preferred embodiment in FIG. 3 comprises a thermally conductive metal or alloy, including copper or aluminum as a major constituent. Preferably, heat sink 12 is formed from a single piece of material in order to avoid loss of thermal conduction at interfaces or to less conductive materials. The thermal expansion coefficient of the heat sink preferably is similar to that of the substrate, in order to lessen stresses on the adhesives or at the interfaces.

The heat sink 12 having a pedestal 120 and a base 124 formed from a single piece of thermally conductive material includes three horizontal surfaces and two sets of vertical walls. The first horizontal surface 121 of the pedestal is approximately 50 to 100 microns smaller than the window 133 in the substrate 13 (FIG. 2). Space between the pedestal walls and the substrate window is filled with an adhesive during attachment of the substrate to the heat sink. The first surface 121 of the heat sink pedestal is preferably larger than the area of the chip and serves as the chip mount pad.

The first vertical sidewalls 122 of the pedestal are approximately equal to the thickness of substrate 13, and extend from the first horizontal surface 121 to the second horizontal surface 123 of the heat sink. The second horizontal surface atop the base 124 forms a shelf 123 to which the substrate 13 is adhered for completion of the device assembly.

A second set of vertical side walls 125 extend between the shelf 123 and a third horizontal surface 126. The third horizontal surface 126 is the bottom of the heat sink, and may provide contact to a PCB or alternate heat sink device.

The perimeter of the shelf 123 and height of the base 124 are related to location and size of solder balls in the array. BGA devices include a wide range of solder ball sizes, typically from 170 to 500 microns in diameter.

The height of base 124 is approximately equal to or slightly less than the solder ball diameter, and a clearance of approximately one solder ball diameter is provided between the perimeter of the base and the nearest row of solder balls, thereby providing space to avoid contact during the reflow process.

The shape of the heat sink base preferably is either square or rectangular, and preferably is as large as possible without interfering with interconnections or solder balls during the reflow process. Base 124 of the sink provides a standoff for the package during the reflow process of the solder balls to a PCB or next level of interconnection, and the relatively large area of the base aids in leveling the package during the reflow process.

Figure 4:
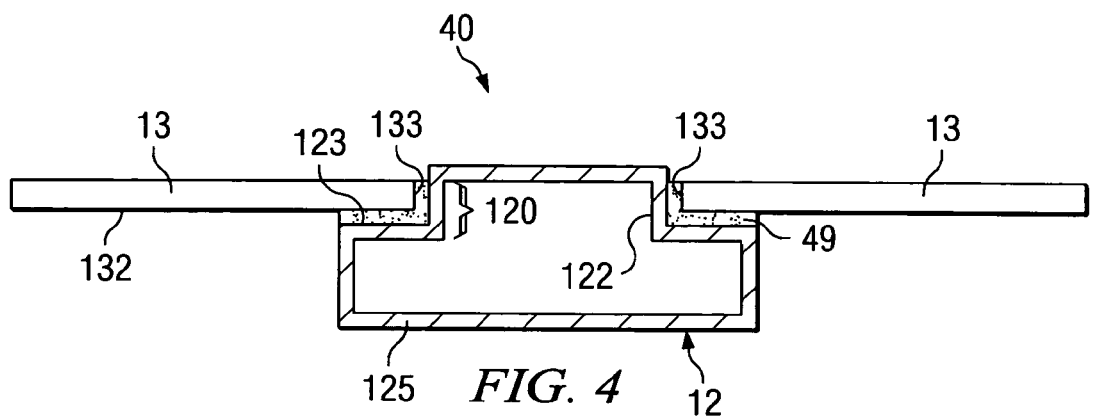
FIG. 4 illustrates the substrate and heat sink assemblage of the first embodiment.

FIG. 4 is a cross sectional view of heat sink 12 and substrate 13 assemblage 40 of the first embodiment. Heat sink 12 has been fabricated to include a shelf 123 and a pedestal 120. The pedestal 120 extends through the window 133 in the substrate 13 and is nearly flush with the first surface of the substrate or slightly above the surface. An adhesive 49 secures the surface of the shelf 123 and vertical walls 122 of the pedestal 120 to the underside 132 and window opening 133 of substrate 13. Adhesive 126 has sufficient electrometric properties to absorb thermal expansion mismatches between the substrate 13 and heat sink 12. The thickness of adhesive 126 is in the range of 25 to 100 microns and fills the space between the sidewalls 122 and the substrate window 133. The assemblage provides a single stable unit for completion of the device fabrication.

Adhesion of the sink to chip adhesive 19 (FIG. 5) and to substrate adhesive 125 is enhanced by a thin coating of an adhesion promoting material on the heat sink which provides either or both a substantially increased surface area or reactive bonding sites. In one embodiment the coating on sidewalls 122 comprises an anodized surface of the base material. An alternate coating of the sink 12 includes an applied layer of a material 122 having a large surface area, such as a deposited aluminum oxide. In yet another embodiment, an adhesion promoter of a compound having a reactive terminal group, such as a silane, coats the sink surface. Adhesive 126 coupled with adhesion promoting surface 125 on the sink further provides a barrier against ingress of moisture and other contaminants into the finished device.

Figure 5:
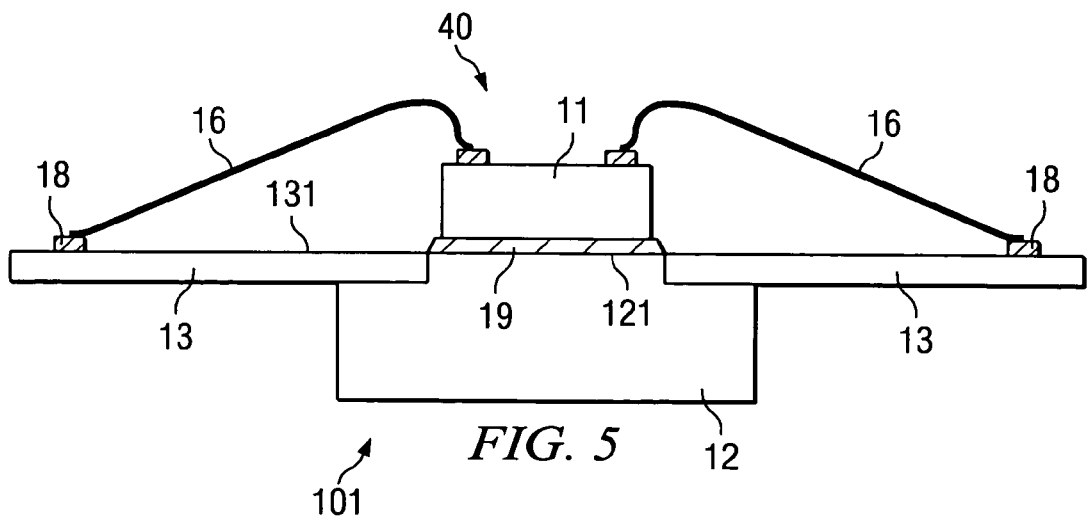
FIG. 5 illustrates a chip and wires bonded to the substrate and heat sink assemblage.

FIG. 5 illustrates a partially assembled device 101 of the preferred embodiment including the heat sink 12, substrate 13, and semiconductor chip 11 connected electrically and mechanically to the heat sink 12 and substrate 13 assemblage 40. Chip 11 is adhered to the first surface of the heat sink pedestal 121 by a thermally conductive material 19, such as a silver filled epoxy or thermal grease. The chip terminals are electrically connected to bond pads 18 on the first surface 131 of the substrate by bond wires 16, preferably comprising gold. Processes and equipment for wire bonding chips to BGA substrates are known in the industry.

In order to complete assembly of the thermally enhanced BGA device, illustrated in FIG. 1, the chip 11, first surface of the substrate 131, and the bond wires 16 are encased in a polymeric material 15, such as a molded thermosetting epoxy compound, and solder balls 17 are connected at the second surface 132 of the substrate by a reflow process.

Figure 6:
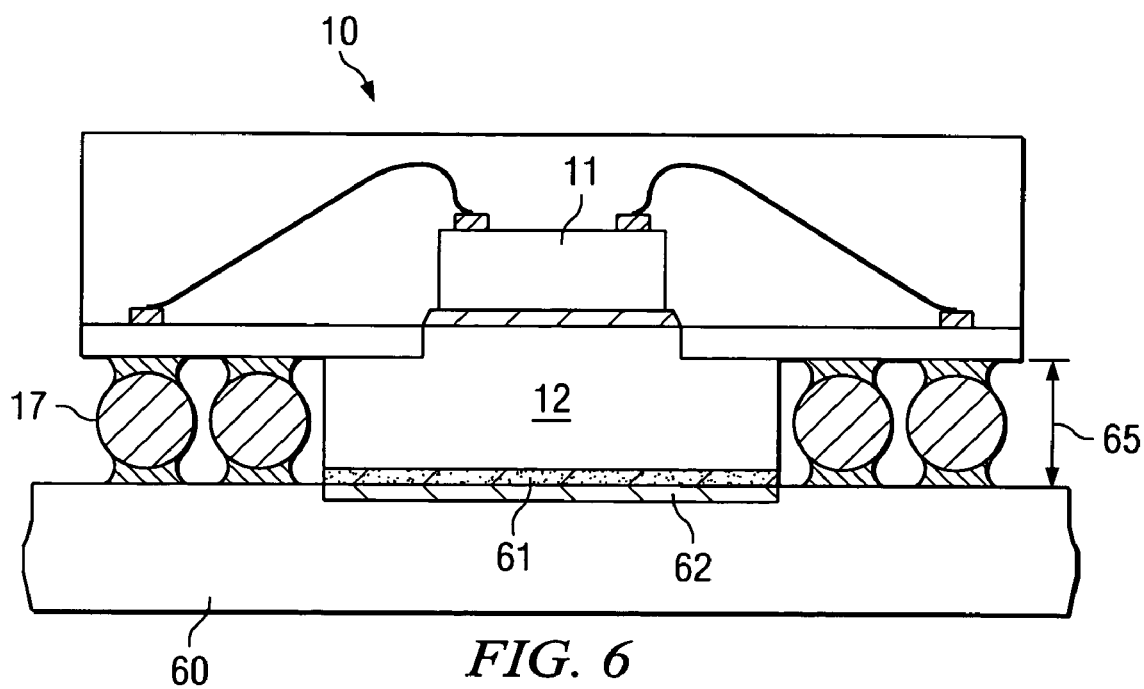
FIG. 6 demonstrates a thermally enhanced BGA package of the current invention attached to a PCB.

In FIG. 6 thermally enhanced BGA device 10 is mounted in contact with printed wiring board 60. Contact between the heat sink 12 and a heat dissipating pad 62 in PCB 60 may be made by thermal grease 61 or other thermally conductive material. PCB 60 is not a subject of the present invention, but is shown to demonstrate the heat flow path illustrated in FIG. 7.

Figure 7:
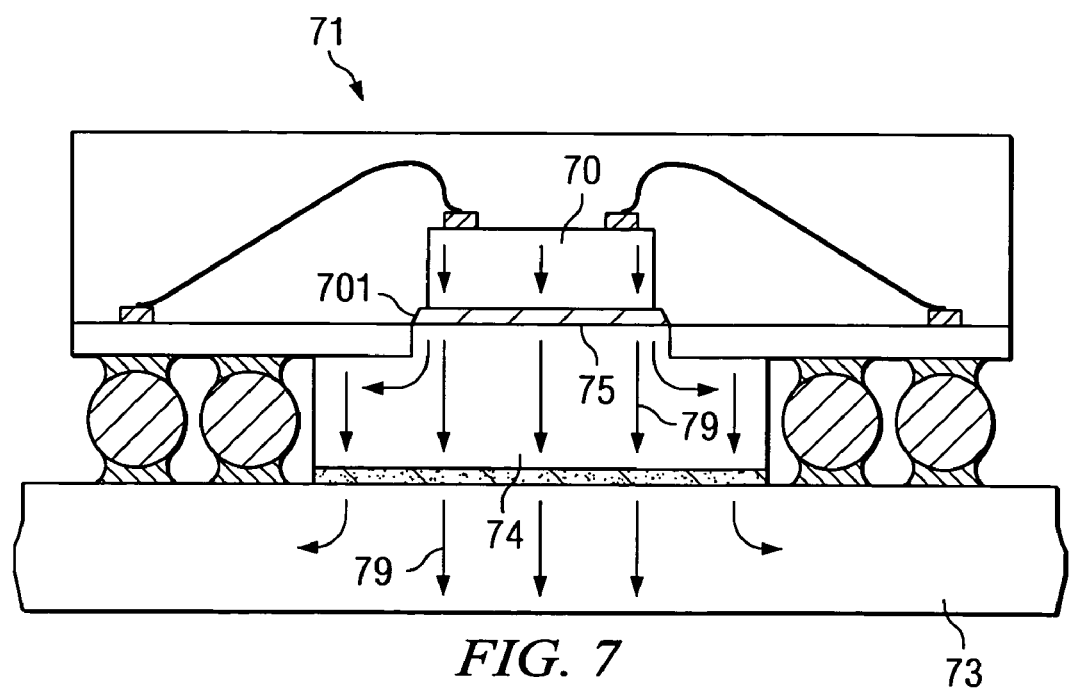
FIG. 7 illustrates the heat flow path in a thermally enhanced BGA package of the present invention.

In FIG. 7, arrows 79 illustrate heat flow paths from semiconductor chip 70 through heat sink 74 of the thermally enhanced BGA package 71 and into PCB 73. Heat developed during operation of the chip 70 is dissipated through chip backside 701, the thermally conductive adhesive 75, and into the heat sink 74. Heat is spread across the width of heat sink 74 and is dissipated into the PCB 73. Conventional BGA packages lack a metal lead frame, such as the frames included in leaded packages, which help both in spreading and dissipating heat through the leads. Only a small amount of heat can be dissipated through thin metal conductors in low density BGA substrates.

FIG. 6 illustrates a further advantage of the expanded width heat sink 12 by providing a fixed stand-off height 65 between the device 10 and the PCB 60 during reflow attachment of the solder balls 17. The rigid heat sink 12 prevents the solder balls 17 from collapsing excessively and the broad base aids in holding the device 10 planar and parallel to the PCB 60.

Figure 8A:
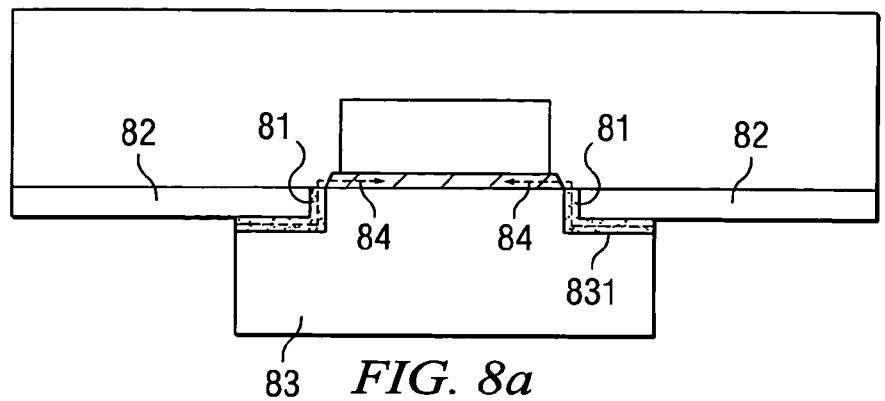
FIG. 8a demonstrates areas of heat sink attachment which deter ingress of contamination into the package.
Figure 8B:
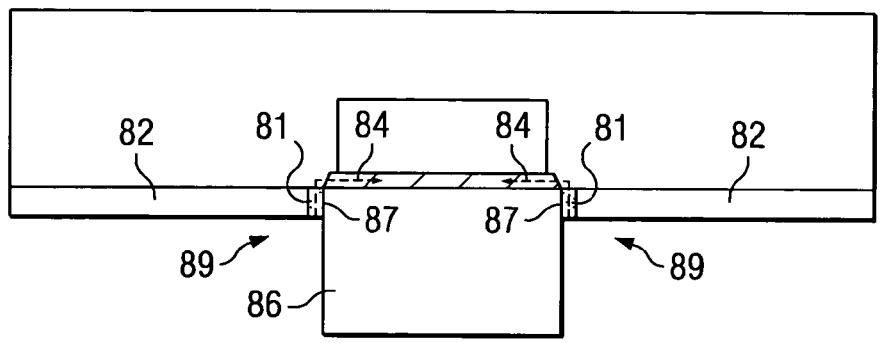
FIG. 8b illustrates a prior art package with a straight wall heat sink.

In FIG. 8a adhesive 81 bonds heat sink 83 to substrate 82. The large surface area for adhesion provided by the expanded heat sink 83 configured with a shelf 831 to which the substrate 82 is attached results in a relatively long path 84 for ingress of potential contaminants into the package. This may be compared in FIG. 8b to the much shorter and direct path 89 of ingress at a heat sink 86 to substrate 87 interfaces, typical of known devices having a simple straight wall heat sink. Similarly, devices having thermal vias provide a direct route for ingress of moisture or contaminants into the package.

Further, the heat sink surfaces of the current invention having an adhesion promoting coating 125 similar to that shown in FIG. 4 increase surface area, as well as enhance adhesion between an adhesive and the substrate, thereby lessening the danger of ingress of contaminants into the package.

Figure 9:
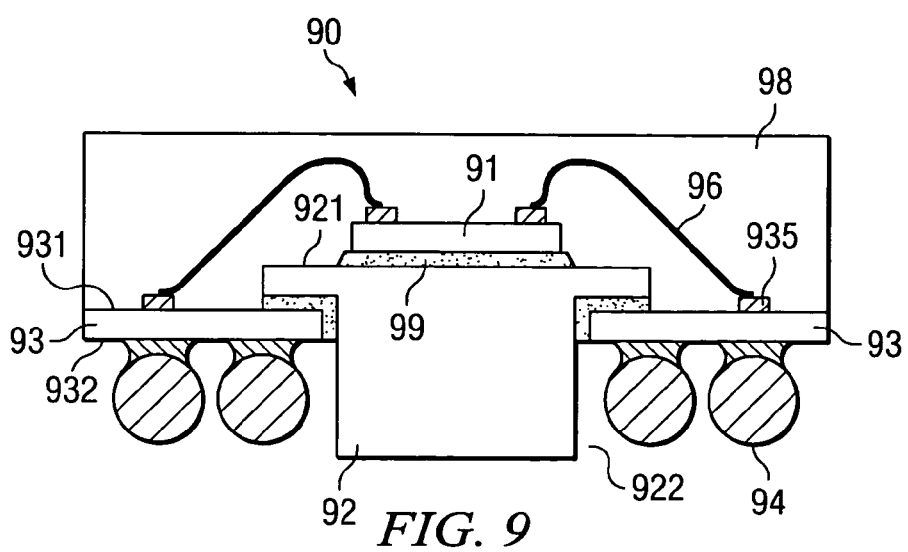
FIG. 9 demonstrates a thermally enhanced BGA packaged semiconductor device having a "T" shaped heat sink.

In FIG. 9, a second embodiment of thermally enhanced BGA package 90 includes semiconductor chip 91 adhered to the first horizontal surface 921 of a "T" shaped heat sink 92 by a thermally conductive adhesive 99, substrate 93 having a window through which the vertical trunk 922 of the "T" shaped heat sink extends, a plurality of bond pads 935 on the first surface 931, and an array of solder balls 94 on the second surface 932. Chip 91, bond wires 96, and first surface 931 of the substrate are encapsulated in a thermosetting molding compound 98. Heat dissipated by the chip is spread across the horizontal section of the heat sink 92 and into the vertical trunk 922 for further dissipation into a PBC or alternate heat sink. Materials of construction and processes are similar to those described for the first embodiment of the thermally enhanced BGA device. The heat sink trunk 922 is aligned through the window in the substrate 93 and the top portion of the "T" shaped sink 92 is adhered to the first surface of the substrate 931, the heat sink and substrate assemblage is processed through the remaining fabrication steps.

It will be recognized that modifications to the thermally enhanced BGA packaged semiconductor device will become apparent to those skilled in the art. Therefore, it is intended that the appended claims be interpreted as broadly as possible.

What is claimed is:

1. A thermally enhanced BGA packaged semiconductor device including:
   a heat sink comprising a thermally conductive material having a pedestal on a wider base,
   a substrate having first and second surfaces and a centrally located window opening, a plurality of bond pads on said first surface and a plurality of solder balls on said second surface;
   an adhesive adhering said heat sink base to said second surface of the substrate;
   a semiconductor chip adhered to said heat sink pedestal;
   a plurality of bond wires electrically connecting said chip to said bond pads; and
   an encapsulation material enclosing said first substrate surface, said chip and said bond wires.

2. The thermally enhanced semiconductor device of claim 1 wherein said heat sink surfaces include:
   a first horizontal surface on a pedestal extending from a wider base, a second horizontal surface on said base, forming a shelf surrounding said pedestal,
a third horizontal surface forming the bottom of said base,
a first set of vertical walls connecting the first to second horizontal surfaces, and
a second set of vertical walls connecting the second to third horizontal surfaces.

3. The thermally enhanced semiconductor device of claim 1 wherein said heat sink comprises an alloy of copper.

4. The thermally enhanced semiconductor device of claim 1 wherein said heat sink comprises an alloy of aluminum.

5. The thermally enhanced semiconductor device of claim 1 wherein said heat sink comprises a single integrated piece of material.

6. The thermally enhanced semiconductor device of claim 1 wherein the height of said heat sink pedestal is approximately equal to the thickness of said substrate.

7. The thermally enhanced semiconductor device of claim 1 wherein said substrate comprises a laminate material.

8. The thermally enhanced semiconductor device of claim 1 wherein said substrate comprises a flexible film.

9. The thermally enhanced semiconductor device of claim 1 wherein said first surface of said heat sink is larger than said chip.

10. The thermally enhanced semiconductor device of claim 1 wherein the height of said heat sink base is approximately equal to the diameter of said solder balls.

11. The thermally enhanced semiconductor device of claim 1 wherein a clearance approximately equal to the diameter of one solder ball is provided between the perimeter of said heat sink base and the innermost row of solder balls.

12. The thermally enhanced semiconductor device of claim 1 wherein said heat sink includes an adhesion promoting coating.

13. The thermally enhanced semiconductor device of claim 1 wherein said heat sink base and said pedestal are square or rectangular.

14. The thermally enhanced semiconductor device of claim 1 wherein said chip is attached to the heat sink pedestal by a thermally conductive material.

15. The thermally enhanced semiconductor device of claim 1 wherein said heat sink base is a rigid stand-off structure.

16. A thermally enhanced BGA packaged semiconductor device including:
a "T" shaped heat sink comprising a thermally conductive material having horizontal section on a vertical trunk,
a substrate having first and second surfaces and a centrally located window opening, a plurality of bond pads on said first surface, and a plurality of solder balls on said second surface;
an adhesive material adhering the underside of said horizontal portion of the heat sink to said first surface of the substrate;
a semiconductor chip adhered to the first horizontal surface of said heat sink;
a plurality of bond wires electrically connecting said chip to substrate bond pads; and
an encapsulation material enclosing said first substrate surface, said chip and said bond wires.

17. A heat sink for thermally enhanced semiconductor packages comprising:
a single piece of a thermally conductive material having a first horizontal surface on a pedestal extruding from a wider base, a second horizontal surface forming a shelf surrounding said pedestal, a third horizontal surface forming the bottom of said base, a first set of vertical walls connecting the first and second horizontal surfaces and a second set of vertical walls connecting the second and third horizontal surfaces.

18. A heat sink as in claim 17 wherein said structure is "T" shaped having a horizontal section wider than the vertical section.

19. The heat sink of claim 17 for thermally enhanced semiconductor packages wherein said heat sink comprises an alloy of copper or aluminum.

20. A method for assembling a thermally enhanced Ball Grid Array semiconductor device, including the steps of:
providing a substrate or interposer having first and second surfaces and a centrally located window opening, a plurality of bond pads on said first surface and a plurality of solder ball contact locations on said second surface;
providing a heat sink comprising a thermally conductive material having a pedestal on a wider base;
aligning said heat sink pedestal to the substrate window and attaching said heat sink shelf to the second surface of said substrate by an adhesive to form a single structure for assembly of said device;
adhering a semiconductor chip to said first surface of said heat sink by a thermally conductive material and electrically connecting said chip to said bond pads on said first surface of the substrate by wire bonds;
encapsulating said first substrate surface, said chip and bond wires by molding with a thermosetting resin.

* * * * *